(12) United States Patent
Hikita

(10) Patent No.: US 7,587,113 B2
(45) Date of Patent: Sep. 8, 2009

(54) OPTICAL WAVEGUIDE

(75) Inventor: Takami Hikita, Ibaraki (JP)

(73) Assignee: Nitto Denko Corporation, Ibaraki-Shi (JP)

( * ) Notice: Subject to any disclaimer, the term of this patent is extended or adjusted under 35 U.S.C. 154(b) by 0 days.

(21) Appl. No.: 12/122,177

(22) Filed: May 16, 2008

(65) Prior Publication Data

US 2008/0285931 A1      Nov. 20, 2008

Related U.S. Application Data

(60) Provisional application No. 60/951,040, filed on Jul. 20, 2007.

(30) Foreign Application Priority Data

May 17, 2007    (JP)    ............................. 2007-131992

(51) Int. Cl.
G02B 6/10    (2006.01)
B32B 27/00    (2006.01)
(52) U.S. Cl. ..................................... 385/129; 428/462
(58) Field of Classification Search ................. 385/129; 428/462
See application file for complete search history.

(56) References Cited

U.S. PATENT DOCUMENTS

| | | | |
|---|---|---|---|
| 2005/0129877 A1* | 6/2005 | Akada et al. ................. | 428/1.6 |
| 2006/0171627 A1 | 8/2006 | Aoki et al. | |
| 2007/0237963 A1* | 10/2007 | Hikita ..................... | 428/411.1 |

FOREIGN PATENT DOCUMENTS

| | | |
|---|---|---|
| EP | 1 657 268 A1 | 5/2006 |
| EP | 1 842 849 A1 | 10/2007 |
| JP | 2004-346155 A | 12/2004 |
| JP | 2005-017940 A | 1/2005 |
| JP | 2007070321 A * | 3/2007 |
| JP | 2007-113018 A | 5/2007 |

OTHER PUBLICATIONS

Communication dated Sep. 4, 2008, European Patent Application No. 08008943.6.

* cited by examiner

*Primary Examiner*—Charlie Peng
(74) *Attorney, Agent, or Firm*—Westerman, Hattori, Daniels & Adrian, LLP.

(57) ABSTRACT

An optical waveguide having excellent resistance to moisture, which includes an under cladding layer 2a formed on a substrate 1, core portions 3 formed in a predetermined pattern on the above-mentioned under cladding layer 2a for propagating an optical signal, and an over cladding layer 2b formed so as to cover the above-mentioned core portions 3. At least either the above-mentioned cladding layers 2a and 2b or the core portions 3 are formed of a resin composition containing a polyfunctional oxetane compound having a dicyclopentadiene ring which is represented by the following general formula (1):

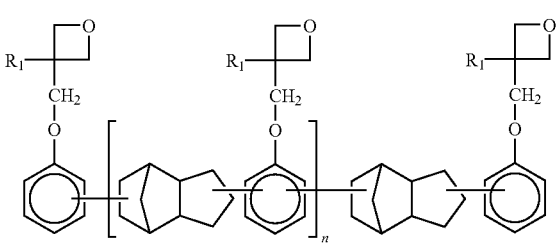

wherein the groups $R_1$ may be the same as or different from each other and each represent a hydrogen atom or an alkyl group having one to six carbon atoms, and n is 0 or a positive number ranging from 1 to 5.

3 Claims, 2 Drawing Sheets

OPTICAL WAVEGUIDE

RELATED APPLICATIONS

This application claims the benefit of U.S. Provisional Application No. 60/951,040, filed Jul. 20, 2007, which is hereby incorporated by reference.

BACKGROUND OF THE INVENTION

1. Field of the Invention

The present invention relates to an optical waveguide including a major component molded from a material for formation using a polyfunctional oxetane compound having a dicyclopentadiene ring.

2. Description of the Related Art

In recent years, optical waveguides have been incorporated in optical waveguide devices, optical integrated circuits, optical wiring boards and the like, and have been widely used in the field of optical communications, optical information processing, and other general optics. A resin compound which can undergo photo initiated cationic polymerization or which can be cured is used as a material for the formation of components of the above-mentioned optical waveguides. A large number of monofunctional and polyfunctional ultraviolet curable resin compositions have been developed and used as a material for the formation of cladding layers of optical waveguides (see, for example, Japanese Patent Application Laid-Open No. 2005-17940).

However, many of the above-mentioned ultraviolet curable resin compositions have poor resistance to moisture, and are disadvantageous in being prone to take up moisture when an optical waveguide is produced, for example, by using such ultraviolet curable resin compositions as a material for the formation of the optical waveguide. Thus, the above-mentioned moisture absorption causes a change in dimensions of the optical waveguide, resulting in increased optical losses.

SUMMARY OF THE INVENTION

In view of the foregoing, it is therefore an object of the present invention to provide an optical waveguide having excellent resistance to moisture.

To accomplish the above-mentioned object, an optical waveguide according to the present invention comprises a substrate, a cladding layer formed on the substrate, and a core portion formed in a predetermined pattern in said cladding layer for propagating an optical signal, wherein at least one of said cladding layer and the core portion is formed of a resin composition containing a polyfunctional oxetane compound having a dicyclopentadiene ring which is represented by the following general formula (1):

wherein the groups $R_1$ may be the same as or different from each other and each represent a hydrogen atom or an alkyl group having one to six carbon atoms, and n is 0 or a positive number ranging from 1 to 5.

The present inventor has focused attention on an oxetane compound useful as a polymer useful as a material for the formation of an optical waveguide having excellent resistance to moisture, and has diligently studied to invent an oxetane compound exhibiting an excellent characteristic regarding resistance to moisture. As a result of experiments on various oxetane compounds having special structures, the present inventor has found that the intended object as described above is accomplished by the use of a polyfunctional oxetane compound having a dicyclopentadiene ring which is represented by the above-mentioned general formula (1). Thus, the present inventor has attained the present invention. Specifically, the polyfunctional oxetane compound having the above-mentioned special structure has fast curability because it has a plurality of oxetane rings in a single molecule, and has excellent resistance to moisture because the hardened material forms a high-density network structure. The above-mentioned polyfunctional oxetane compound, which is somewhat high in molecular weight, has a high viscosity. This is advantageous in forming a thick film. When the above-mentioned polyfunctional oxetane compound is used as a material for the formation of an optical waveguide (the cladding layer and the core portion), the optical waveguide is easy to harden and easy to make into the same shape with stability. This produces the effect of stabilizing optical waveguide characteristics and the like.

In this manner, the present invention relates to the optical waveguide in which at least one of the cladding layer and the core portion is formed of a resin composition containing a polyfunctional oxetane compound having a dicyclopentadiene ring which is represented by the above-mentioned general formula (1). Thus, at least one of the cladding layer and the core portion which is made of the resin composition containing the polyfunctional oxetane compound having the above-mentioned special structure exhibits low hygroscopicity. As a result, this provides the optical waveguide having excellent waveguide characteristics in which the increase in optical losses of the optical waveguide is suppressed.

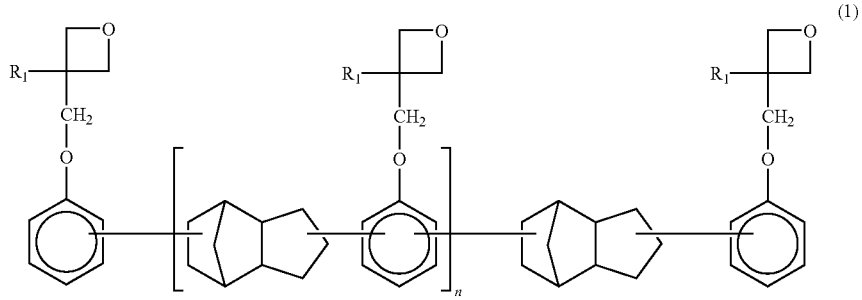

DETAILED DESCRIPTION OF PREFERRED EMBODIMENTS

A preferred embodiment according to the present invention will now be described.

Figure 1:
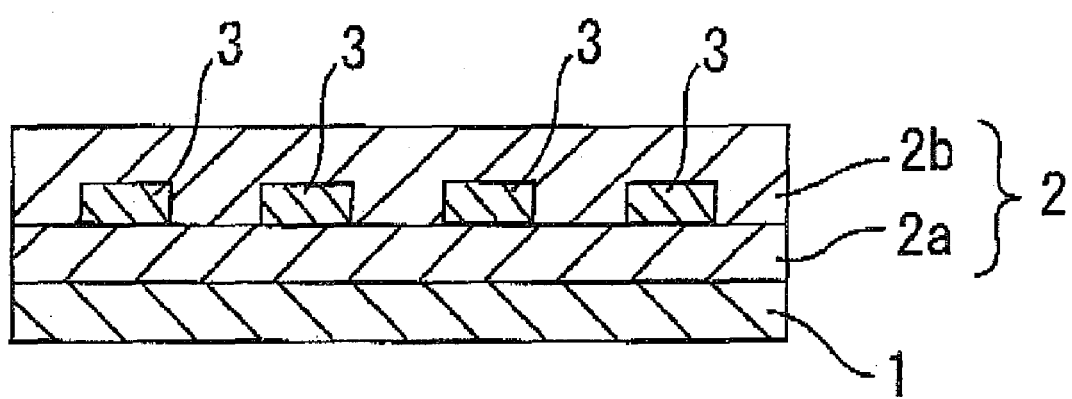
FIG. 1 is a transverse sectional view showing an example of an optical waveguide according to the present invention.

An optical waveguide having a structure as shown in FIG. 1 is an illustration of an example of the optical waveguide according to the present invention. Specifically, the optical waveguide includes a substrate 1, a cladding layer 2 formed on the substrate 1, and core portions 3 formed in a predetermined pattern in the above-mentioned cladding layer 2 for propagating an optical signal. The above-mentioned cladding layer 2 includes an under cladding layer 2a formed on the substrate 1, and an over cladding layer 2b formed so as to cover the core portions 3 formed in the predetermined pattern on the under cladding layer 2a. In the optical waveguide according to the present invention, at least either the above-mentioned cladding layer 2 or the core portions 3 are formed of a resin composition containing a polyfunctional oxetane compound having a special structure and having a dicyclopentadiene ring. It is necessary that the above-mentioned cladding layer 2 have a refractive index less than that of the core portions 3.

A material for the formation of the above-mentioned substrate 1 is not particularly limited, but may be a conventionally known material. Examples of such a material include polyethylene naphthanates, quartz glass plates, silicon wafers, ceramic substrates, glass epoxy resin substrates, polyimide films, metal foil such as copper foil and stainless steel foil, and the like. The thickness of the substrate 1 is set as appropriate, and is generally in the range of 10 μm to 5 mm.

In the optical waveguide according to the present invention, at least either the above-mentioned cladding layer 2 or the core portions 3 are formed of a resin composition containing a polyfunctional oxetane compound having a special structure and having a dicyclopentadiene ring.

The polyfunctional oxetane compound having the above-mentioned dicyclopentadiene ring is a compound represented by the general formula (1) given below, and is structured to have two (where n=0) to seven (where n=5) oxetane rings in a single molecule. In the general formula (1), $R_1$ is a hydrogen atom or an alkyl group having one to six carbon atoms. Examples of the alkyl group include a methyl group, an ethyl group, a propyl group, a butyl group and the like. Preferable examples of the alkyl group are a methyl group and an ethyl group, The polyfunctional oxetane compound having the dicyclopentadiene ring which is represented by the above-mentioned general formula (1) may be manufactured by using phenols represented by the general formula (2) given below, a sulfonate of 3-alkyl-3-hydroxymethyl-oxetane represented by the general formula (3) given below, and a base as synthetic raw materials for a synthesis reaction.

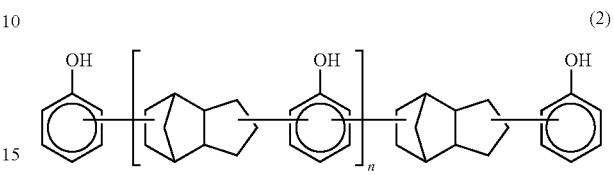

(2)

wherein n is 0 or a positive number ranging from 1 to 5.

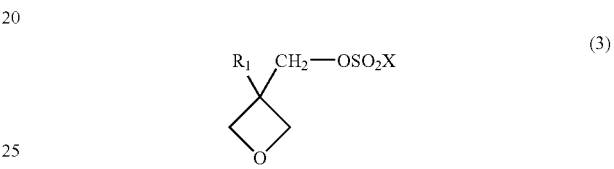

(3)

wherein $R_1$ is a hydrogen atom or an alkyl group having one to six carbon atoms, and X is selected from the group consisting of a methyl group, an ethyl group, a phenyl group and a tolyl group.

The above-mentioned base conceivably used herein may be a conventionally known alkali metal (sodium hydroxide, potassium hydroxide and the like). However, a cesium salt is preferably used as the above-mentioned base according to the present invention because the use of the cesium salt as the above-mentioned base achieves the synthesis of the compound represented by the general formula (1) in high yields without involving complicated manipulation. In this case, examples of the synthesis reaction using the raw materials are as follows; (i) causing the phenols to react with the cesium salt, thereby obtaining a cesium phenolate, and then causing the cesium phenolate to react with oxetane sulfonate, and (ii) causing oxetane sulfonate to react with the phenols in the presence of the cesium salt. Preferably, the synthesis reaction is done by following the above-mentioned procedure (ii). In

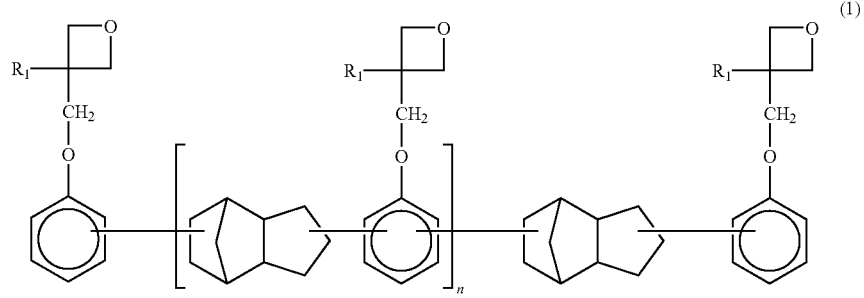

(1)

wherein the groups $R_1$, may be the same as or different from each other and each represent a hydrogen atom or an alkyl group having one to six carbon atoms, and n is 0 or a positive number ranging from 1 to 5.

general, the above-mentioned synthesis is performed in an organic solvent (a reaction solvent). After the completion of the above-mentioned synthesis reaction, an organic solvent and water are added to the reaction liquid to separate the reaction liquid into an aqueous phase and an organic phase. Extraction from the organic phase provides the intended polyfunctional oxetane compound having the dicyclopentadiene ring.

Examples of the above-mentioned cesium salt include cesium carbonate, cesium hydroxide, cesium fluoride, cesium formate and the like. Of these, cesium carbonate is preferably used from the viewpoint of providing the intended polyfunctional oxetane compound having the dicyclopentadiene ring in higher yields.

The amount of the above-mentioned cesium salt used is preferably in the range of 0.8 to 2.0 moles, more preferably in the range of 1.0 to 1.5 moles, per mole of a phenolic hydroxyl group of the phenols represented by the general formula (2).

The phenols represented by the above-mentioned general formula (2) include a polyfunctional phenol having what is called a dicyclopentadiene skeleton.

In the sulfonate of 3-alkyl-3-hydroxymethyl-oxetane represented by the above-mentioned general formula (3) for use with the above-mentioned phenols, $R_1$ in the formula (3) is an alkyl group having one to six carbon atoms. Examples of the alkyl group include a methyl group, an ethyl group, a propyl group, a butyl group and the like. Preferable examples of the alkyl group are a methyl group and an ethyl group. Specific examples thereof include 2-(3-oxetanyl)propylmesylate, 2-(3-oxetanyl)propylphenyl sulfonylate, 2-(3-oxetanyl)propyltosylate, 2-(3-oxetanyl)butylmesylate, 2-(3-oxetanyl)butyltosylate, and the like. These are used either alone or in combination.

The sulfonate of 3-alkyl-3-hydroxymethyl-oxetane represented by the above-mentioned general formula (3) may be synthesized, for example, in conformity with the method disclosed in Organic Synthesis, Collective vol. 1, p. 145 (1941).

The amount of use of the sulfonate of 3-alkyl-3-hydroxymethyl-oxetane represented by the above-mentioned general formula (3) is preferably in the range of 1.5 to 2.0 moles, more preferably in the range of 1.0 to 1.5 moles, per mole of a phenolic hydroxyl group of the phenols represented by the general formula (2).

In the manufacture of the polyfunctional oxetane compound having the dicyclopentadiene ring having the oxetane rings according to the present invention, the reaction temperature for the synthesis thereof is preferably in the range of 0° C. to 120° C., more preferably in the range of 60° C. to 100° C. When the phenols previously react with the cesium salt to thereby obtain the cesium phenolate, the reaction temperature for the production of the cesium phenolate is preferably in the range of 0° C. to 120° C., more preferably in the range of 40° C. to 100° C. Pressure during these reactions is not particularly limited, but may be normal pressure, increased pressure or reduced pressure. A reaction atmosphere may be an inert gas atmosphere such as a nitrogen gas atmosphere, and is not particularly limited.

For the synthesis of the polyfunctional oxetane compound having the above-mentioned dicyclopentadiene ring, alkali metals such as sodium and potassium, alkali metal hydrides such as lithium hydride and sodium hydride, alkali metal hydroxides such as sodium hydroxide and potassium hydroxide, and alkali metal carbonates such as sodium carbonate may be added, as appropriate, as synthetic raw materials.

Additionally, a quaternary ammonium salt, a quaternary phosphonium salt and the like may be added, as required, as a phase transfer catalyst between an aqueous phase and an organic phase. The above-mentioned quaternary ammonium salt is not particularly limited, but examples thereof include tetraalkylammonium halides such as tetrabutylammonium bromide (TBAB) and tetraethylammonium bromide, aralkyltrialkylammonium halides such as benzyltrimethylammonium chloride, and the like. The above-mentioned quaternary phosphonium salt is not particularly limited, but examples thereof include tetraarylphosphonium halides such as tetraphenylphosphonium bromide, and the like.

Further, the reaction solvent is generally used as discussed above in the manufacture of the polyfunctional oxetane compound having the above-mentioned dicyclopentadiene ring. This reaction solvent is not particularly limited, but preferable examples thereof include aromatic hydrocarbons (toluene, xylene and the like), ethers (tetrahydrofuran, dibutyl ether and the like), aprotic polar solvents (N-methylpyrrolidone, N-methyl-2-pyrrolidone, N,N-dimethylformamide, N,N-dimethylacetamide and the like), and the like. These are used either alone or in combination.

The polyfunctional oxetane compound having the dicyclopentadiene ring which is synthesized from these raw materials is generally obtained by adding water and an organic solvent (ethyl acetate or the like) to the reaction liquid to separate the reaction liquid into an aqueous phase and an organic phase as mentioned above, cleaning the organic phase with water, a saline solution and the like, drying the cleaned organic phase with anhydrous magnesium sulfate and the like, thereafter filtering off magnesium sulfate, and then distilling off the solvent.

In the optical waveguide according to the present invention, it is preferred that at least either the above-mentioned cladding layer 2 or the core portions 3 are formed of a resin composition containing the polyfunctional oxetane compound having the above-mentioned dicyclopentadiene ring and a compound having an epoxy group or a vinyl ether group because this provides a hardened material having excellent moisture resistance and excellent heat resistance and also achieves improvements in exposure sensitivity. The compound having the above-mentioned epoxy group used herein may be any such compound that is compatible with the polyfunctional oxetane compound having the dicyclopentadiene ring which is represented by the above-mentioned general formula (1). Specifically, examples of an epoxy compound having one epoxy group include phenyl glycidyl ether, butyl glycidyl ether and the like. Preferable examples of an epoxy compound having two or more epoxy groups include bisphenol-A diglycidyl ether, bisphenoxyethanolfluorene diglycidyl ether, trimethylolpropane tridiglycidyl ether, and bisphenolfluorene tetraglycidyl ether. Preferable examples of a compound having an alicyclic epoxy group include 3',4'-epoxycyclohexylmethyl-3,4-epoxycyclohexane carboxylate, an adduct of 1,2-epoxy-4-(2-oxylanyl)cyclohexane of 2,2-bis (hydroxymethyl)-1-butanol, and the like. The compound having the above-mentioned vinyl ether group used herein may be any such compound that is compatible with the compound represented by the above-mentioned general formula (1). Specifically, examples of a compound having one vinyl ether group include hydroxyethyl vinyl ether, hydroxybutyl vinyl ether, dodecyl vinyl ether, and the like. Preferable examples of a compound having two or more vinyl ether groups include cyclohexanedimethanol divinyl ether, triethylene glycol divinyl ether, novolac type divinyl ether, and the like. These compounds are used either alone or in combination.

In the optical waveguide according to the present invention, an example of a combination of the material for the formation of the cladding layer 2 and the material for the formation of the core portions 3 is as follows: a resin composition containing the polyfunctional oxetane compound having the above-mentioned dicyclopentadiene ring and a compound having an epoxy group or a vinyl ether group is used as the material for the formation of the cladding layer 2, and a resin composition containing an oxetane compound other than the polyfunctional oxetane compound having the above-mentioned dicyclopentadiene ring and a compound having an epoxy group or a vinyl ether group is used as the material for the formation of the core portions 3. Examples of the oxetane compound other than the polyfunctional oxetane compound having the above-mentioned dicyclopentadiene ring include trifunctional oxetane compounds such as 1,3,3-tris(4-(2-(3-oxetanyl)butoxyphenyl)butane) and the like. Materials for the formation of the cladding layer 2 are preferably such that the material for the formation of the over cladding layer 2b and the material for the formation of the under cladding layer 2a are the same.

Preferably, the resin composition contains 10 to 60% by weight of the polyfunctional oxetane compound having the above-mentioned dicyclopentadiene ring.

A photo-acid generator is mixed, as appropriate, into the resin composition for the purpose of imparting an ultraviolet curing property to the resin composition. Other additives are further mixed, as required, into the resin composition.

The above-mentioned photo-acid generator is not particularly limited, but a conventionally known photo-acid generator is used. Examples of the photo-acid generator include aromatic diazonium salts, aromatic sulfonium salts, aromatic iodonium salts, aromatic sulfoxonium salts, metallocene compounds, iron arene compounds, and the like. Of these, aromatic sulfonium salts are preferably used from the viewpoint of their photo curing property. In particular, the use of an aromatic sulfonium hexafluoroantimonate compound such as 4,4-bis[di($\beta$-hydroxyethoxy)phenylsulfinio]phenyl-sulfide-bis-hexafluoroantimonate, the use of an aromatic sulfonium hexafluorophosphonium compound, or the use of both in combination is preferable from the viewpoint of a curing property, adhesion and the like. In addition to the above-mentioned photo-acid generator, appropriate additives including a photosensitizer, an acid proliferator and the like may be further mixed, as required, into the resin composition. Preferably 0.1 to 10 parts, more preferably 1 to 5 parts, by weight of the above-mentioned photo-acid generator is contained, based upon 100 parts by weight of a polymer component.

Examples of the above-mentioned other additives include silane coupling agents or titanate coupling agents for the purpose of enhancing adhesion, cycloolefin oligomers or polymers such as olefin oligomers or norbornene polymers, synthetic rubbers, compounds of flexibilizers such as silicone compounds, antioxidants, antifoaming agents, and the like.

Next, the process of manufacturing the optical waveguide according to the present invention which employs the above-mentioned substrate and the materials for the formation of the layers will be described by way of an example.

The optical waveguide according to the present invention can be manufactured through the steps shown in FIGS. 2(a) to (f). First, the substrate 1 is prepared, as shown in FIG. 2(a) As shown in FIG. 2(b), the material for the formation of the under cladding layer is applied onto the surface of the substrate 1 so that the thickness thereof is 5 to 100 μm after drying, and is then dried to form the under cladding layer 2a (a lower portion of the cladding layer 2). When the material for the formation of the above-mentioned under cladding layer 2a is an ultraviolet curable resin composition, the under cladding layer 2a is formed by irradiation with ultraviolet light. After drying or irradiation with ultraviolet light, curing is performed, as required, by heating or the like.

The method of applying the material for the formation of the above-mentioned under cladding layer 2a may be a coating method using spin coating, a coater, a circle drawing coater, a bar coater and the like, a screen printing method, a method of forming a gap by using a spacer to inject the material for the formation of the under cladding layer 2a into the gap by capillarity, a method of coating in a continuous roll-to-roll fashion by using a coating machine such as a multi-coater and the like.

To enhance the adhesion between the above-mentioned under cladding layer 2a and the substrate 1, a surface treatment with a silane coupling agent or an aluminum chelating agent may be performed on the surface of the substrate 1 on which the under cladding layer 2a is to be formed.

Next, as shown in FIG. 2(c), a layer 3' of a resin composition for the formation of the core portions 3 is formed on the above-mentioned under cladding layer 2a. The method of forming the layer 3' may be similar to the method of applying the material for the formation of the above-mentioned under cladding layer 2a.

Then, as shown in FIG. 2(d), a photomask 9 for exposure in a predetermined pattern (optical waveguide pattern) is placed on the surface of the above-mentioned layer 3'. Irradiation with light, such as exposure to ultraviolet light or the like, is performed through the photomask 9, and a heating treatment is performed. The above-mentioned exposure is not particularly limited, but examples thereof include contact exposure, proximity exposure such that the exposure is performed, with the mask 9 slightly spaced apart from the layer 3', projection exposure, and the like. Contact exposure and proximity exposure are preferably employed from the viewpoint of improvements in precision. For the above-mentioned exposure to ultraviolet light, a collimated light beam is preferably used by using a filter and the like.

Next, after the exposure, a developing solution is used to dissolve away an unexposed portion of the layer 3', thereby forming the core portions 3 in a predetermined pattern, as shown in FIG. 2(e). The above-mentioned development may employ known techniques such as puddle development, dip development, spray development and the like. After the development, a cleaning may be further performed, as required. The above-mentioned cleaning may employ, for example, alcohol such as isopropyl alcohol, distilled water, and the like. Post-curing may be performed by heating or the like to accomplish more complete curing of the formed core portions 3.

Next, as shown in FIG. 2(f), the material for the formation of the over cladding layer 2b is used to form the over cladding layer 2b on the under cladding layer 2a with the core portions 3 formed in the above-mentioned predetermined pattern thereon. The method of forming the above-mentioned over cladding layer 2b may be similar to the method of forming the under cladding layer 2a described earlier. As mentioned above, the material for the formation of the above-mentioned over cladding layer 2b and the material for the formation of the under cladding layer 2a are preferably the same. In this manner, the optical waveguide is manufactured which includes the under cladding layer 2a formed in a stacked fashion on the substrate 1, the core portions 3 formed in the predetermined pattern on the above-mentioned under cladding layer 2a, and the over cladding layer 2b formed so as to cover the core portions 3.

The above-mentioned optical waveguide may be in the form of a film-like optical waveguide by stripping away the above-mentioned substrate 1. The optical waveguide having such a configuration is excellent in flexibility.

The optical waveguide thus obtained may be used, for example, as a linear optical waveguide, a curved optical waveguide, a crossing optical waveguide, a Y-branch optical waveguide, a slab optical waveguide, a Mach-Zehnder optical waveguide, an AWG type optical waveguide, a grating, an optical waveguide lens, and the like. Examples of optical devices employing such optical waveguides include a wavelength filter, an optical switch, an optical divider, an optical multiplexer, an optical multiplexer/demultiplexer, an optical amplifier, a wavelength converter, a wavelength divider, an optical splitter, a directional coupler, an optical transmission module provided by hybrid integration of laser diodes and photodiodes, and the like.

Next, inventive examples of the present invention will be described in conjunction with a comparative example. It should be noted that the present invention is not limited to the inventive examples.

Prior to the inventive examples, 2-(3-oxetanyl)butyltosylate which was a sulfonate of 3-alkyl-3-hydroxymethyl-oxetane was synthesized in a manner described below.

[Synthesis of 2-(3-oxetanyl)butyltosylate]

To a 2000-ml three-necked flask including a thermometer, a condenser, a stirrer and a dropping funnel were added 190.65 g (1.0 mol) of p-toluenesulfonic acid chloride, 32.24 g (0.1 mol) of tetramethylammonium bromide and 400 ml of toluene, which in turn were cooled down to 5° C. while being stirred in an ice bath. After 116.16 g (1.0 mmol) of 3-ethylhydroxymethyl-oxetane was added to the mixture, 130 ml of 35% by weight of a sodium hydroxide aqueous solution was dropped from the dropping funnel over 30 minutes. After the completion of the dropping, the above-mentioned flask was stirred at the same temperature for one hour, and was further stirred at room temperature (25° C.) for 16 hours. After the completion of a reaction, 800 ml of water was added into the above-mentioned flask, and was stirred violently. Thereafter, the resultant mixture was allowed to stand until the mixture separated into an aqueous phase and an organic phase. The organic phase was further cleaned with 400 ml of water, and was dried overnight with anhydrous magnesium sulfate. Thereafter, magnesium sulfate was filtered off, and the filtrate was concentrated. A crude product thus obtained was separated and purified by silica gel column chromatography (an eluate: hexane/ethyl acetate) to synthesize 243.3 g (in a yield of 90%) of 2-(3-oxetanyl)butyltosylate which was an intended colorless liquid.

which in turn were stirred in a nitrogen atmosphere at 80° C. for 30 minutes. To this was added 45.1 g (138.5 mmol) of cesium carbonate, which in turn was further stirred in a nitrogen atmosphere at 80° C. for 30 minutes. To this was added 34.3 g (126.9 mmol) of the earlier synthesized 2-(3-oxetanyl) butyltosylate, which in turn was stirred in a nitrogen atmosphere at 80° C. for 20 hours. After the completion of a reaction, the resultant mixture was cooled down to room temperature (25° C.). Thereafter, 100 ml of ethyl acetate and 70 ml of distilled water were added to separate the mixture into an organic phase and an aqueous phase. Then, the organic phase was further cleaned with water and a saturated saline solution, and was dried overnight with anhydrous magnesium sulfate. Next, after magnesium sulfate was filtered off, the solvent was distilled off, whereby a crude reaction product was obtained.

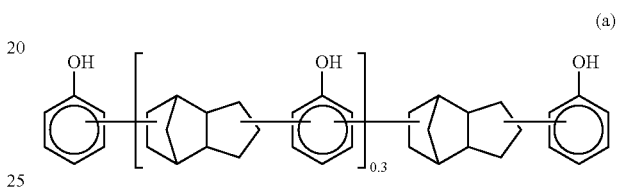

(a)

An analysis of the thus obtained crude product by thin-layer chromatography showed only one spot. This was purified by silica-gel chromatography (an eluate: n-hexane/acetone) to provide 27.7 g (in a yield of 90%) of a yellow solid. The degree of purity of that compound was not less than 99% when tested by liquid chromatography.

An analysis of the thus obtained compound by using an infrared absorption spectrum (manufactured by JASCO Corporation) showed that absorption at 3400 cm$^{-1}$ derived from a raw material phenolic group completely disappeared and absorption at 980 cm$^{-1}$ derived from an oxetanyl group appeared newly. This provided the identification of a polyfunctional oxetane compound having a dicyclopentadiene ring with the oxetanyl group introduced therein which was represented by the structural formula (A) given below. The number of repetitions, n, in the structural formula (A) averaged 0.3.

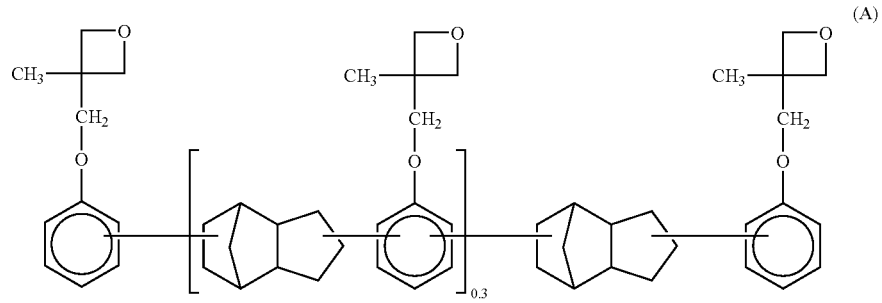

(A)

[First Synthesis of Polyfunctional Oxetane Compound]

To a 200-ml three-necked flask including a thermometer, a condenser tube and a stirrer were added 19.5 g (50.0 mmol) of a polyfunctional phenol (DPP-6095H manufactured by Nippon Oil Corporation) having a dicyclopentadiene skeleton which was represented by the structural formula (a) given below and 90 ml of N,N-dimethylacetamide as a solvent,

[Second Synthesis of Polyfunctional Oxetane Compound]

To a 500-ml three-necked flask including a thermometer, a condenser tube and a stirrer were added 30.0 g (50.0 mmol) of a polyfunctional phenol (DPP-6125 manufactured by Nippon Oil Corporation) having a dicyclopentadiene skeleton which was represented by the structural formula (b) given below and 115 ml of N,N-dimethylacetamide as a solvent, which in turn were stirred in a nitrogen atmosphere at 80° C. for 30 minutes. To this was added 63.4 g (194.6 mmol) of cesium carbonate, which in turn was further stirred in a nitrogen atmosphere at 80° C. for 30 minutes. To this was added 48.2 g (178.4 mmol) of the earlier synthesized 2-(3-oxetanyl)butyltosylate, which in turn was stirred in a nitrogen atmosphere at 80° C. for 20 hours. After the completion of a reaction, the resultant mixture was cooled down to room temperature (25° C.). Thereafter, 140 ml of ethyl acetate and 100 ml of distilled water were added to separate the mixture into an organic phase and an aqueous phase. Then, the organic phase was further cleaned with water and a saturated saline solution, and was dried overnight with anhydrous magnesium sulfate. Next, after magnesium sulfate was filtered off, the solvent was distilled off, whereby a crude reaction product was obtained.

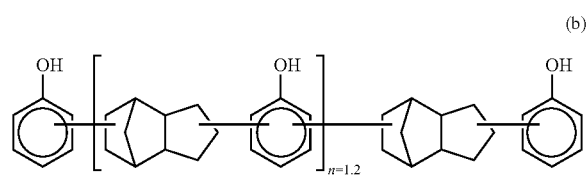

(b)

An analysis of the thus obtained crude product by thin-layer chromatography showed only one spot. This was purified by silica-gel chromatography (an eluate: n-hexane/acetone) to provide 42.3 g (in a yield of 93%) of a yellow solid. The degree of purity of that compound was not less than 99% when tested by liquid chromatography.

An analysis of the thus obtained compound by using an infrared absorption spectrum (manufactured by JASCO Corporation) showed that absorption at 3400 $cm^{-1}$ derived from a raw material phenolic group completely disappeared and absorption at 980 $cm^{-1}$ derived from an oxetanyl group appeared newly. This provided the identification of a polyfunctional oxetane compound having a dicyclopentadiene ring with an oxetanyl group introduced therein which was represented by the structural formula (B) given below. The number of repetitions, n, in the structural formula (B) averaged 1.2.

[Formation of Under Cladding Layer]

First, a resin composition (varnish A) for the formation of a cladding layer (under cladding layer/over cladding layer) was prepared by mixing together 30 parts by weight of a bifunctional aromatic epoxy (bisphenoxyethanolfluorene diglycidyl ether) (component A), 50 parts by weight of 3',4'-epoxycyclohexylmethyl-3,4-epoxycyclohexane carboxylate (CELLOXIDE 2021P manufactured by Daicel Chemical Industries, Ltd.) (component B) which was an alicyclic epoxy resin having a cyclohexene oxide skeleton, 20 parts by weight of a polyfunctional oxetane compound (component C) represented by the aforementioned structural formula (A) which was produced in the above manner, and 2 parts by weight of a 50% propione carbide solution of 4,4-bis[di(β-hydroxyethoxy)phenylsulfinio]phenyl-sulfide-bis-hexafluoroantimonate (component G) as a photo-acid generator.

Next, a polyethylene naphthalate base (250 mm×250 mm×188 μm (thick)) was prepared (see FIG. 2(a)), and the above-mentioned varnish A was applied to a surface of the polyethylene naphthalate base by a spin coating method. After the entire surface was irradiated with ultraviolet light at a dose of 2000 mJ/$cm^2$, a heating treatment was performed at 100° C. for 15 minutes, whereby the under cladding layer was formed (see FIG. 2(b)). The thickness of this under cladding layer was 25 μm when measured with a contact-type film thickness meter. The refractive index of the above-mentioned under cladding layer at a wavelength of 830 nm was 1.545.

[Formation of Core Portions]

Next, a resin composition (varnish B) for the formation of the core portions was prepared by dissolving 50 parts by weight of a bifunctional aromatic epoxy (bisphenoxyethanolfluorene diglycidyl ether) (component A), 22 parts by weight of 1,3,3-tris(4-(2-(3-oxetanyl)butoxyphenyl)butane) (component D) which was a trifunctional oxetane compound, and 1 part by weight of a 50% propione carbide solution of 4,4-bis[di(β-hydroxyethoxy)phenylsulfinio]phenyl-sulfide-bis-hexafluoroantimonate (component G) as a photo-acid generator in 28 parts by weight of ethyl lactate (component F).

Then, the above-mentioned varnish B was applied onto the above-mentioned under cladding layer by a spin coating method, and was dried at 100° C. for 10 minutes, to thereby

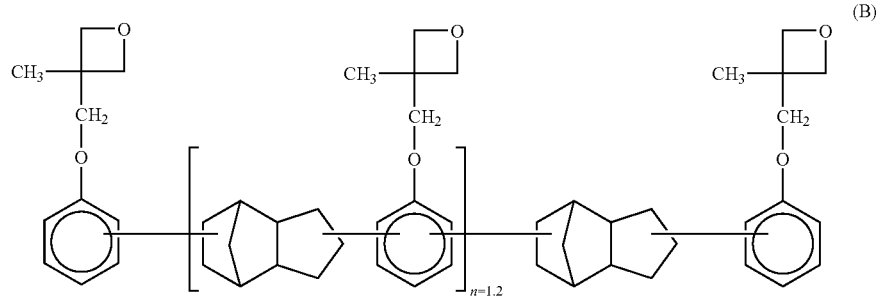

(B)

INVENTIVE EXAMPLE 1

Figure 2:
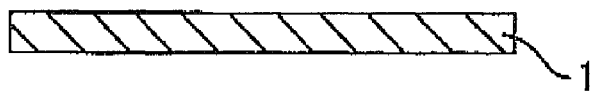
FIGS. 2(*a*) to (*f*) are illustrations showing the process of manufacturing the optical waveguide according to the present invention.
Figure 2:
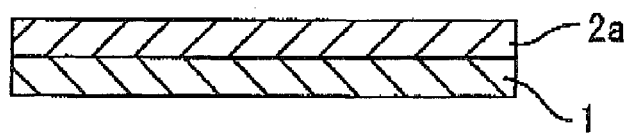
Figure 2:
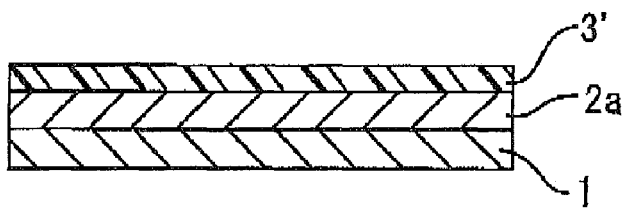
Figure 2:
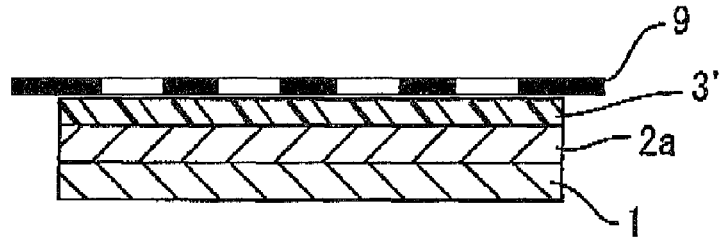
Figure 2:
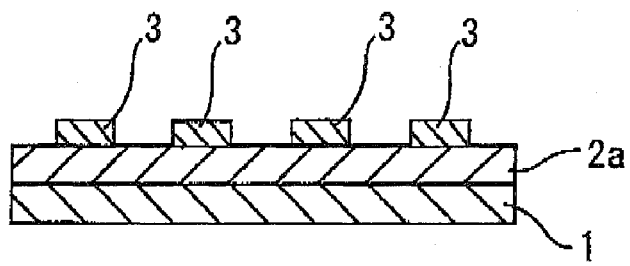
Figure 2:
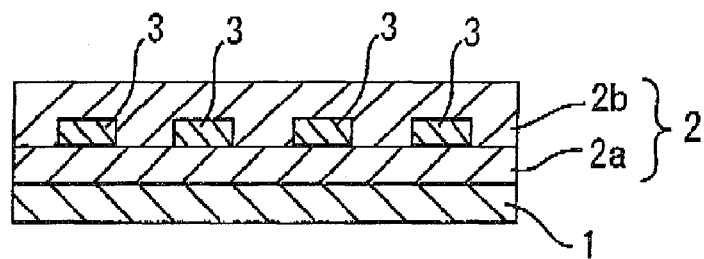

An under cladding layer, core portions and an over cladding layer were formed in a manner to be described below to manufacture an optical waveguide (see FIG. 2). Evaluations were performed on the optical waveguide in a manner to be described below.

form a core portion precursor (see FIG. 2(c)) A synthetic quartz chromium mask (photomask) with a 50-μm-wide strip-shaped optical waveguide pattern drawn therein was placed on the core portion precursor (see FIG. 2(d)). The core portion precursor was irradiated with ultraviolet light at a dose of 4000 mJ/$cm^2$ through the chromium mask by a contact exposure method, and a heating treatment was performed at 120° C. for 15 minutes. Thereafter, development was carried out using an aqueous solution of γ-butyrolactone to dissolve away an unexposed portion. Then, heating was performed at 120° C. for 30 minutes to form a core pattern (see FIG. 2(e)). A core pattern of a rectangular sectional configuration having a width of 50 μm and a height of 50 μm was formed when the core configuration was measured with an electron microscope (VE-7800 manufactured by Keyence Corporation) The refractive index of the core portions thus formed at a wavelength of 830 nm was 1.594.

[Formation of Over Cladding Layer]

The varnish A identical with that prepared for the formation of the under cladding layer was applied onto the above-mentioned under cladding layer and the core portions by a spin coating method. Next, the entire surface was irradiated with ultraviolet light at a dose of 2000 mJ/cm$^2$ in a manner similar to that during the formation of the above-mentioned under cladding layer. Subsequently, a heating treatment was performed at 150° C. for 60 minutes, to thereby form the over cladding layer (see FIG. 2(f)). In this manner, an optical waveguide (see FIG. 1) having a specific refractive index Δ=3.0% was produced.

INVENTIVE EXAMPLE 2

The blending amount of the component B and the blending amount of the component C in the varnish A which was the material for the formation of the cladding layer were changed to 30 parts by weight and 40 parts by weight, respectively. Except for this, Inventive Example 2 was similar to Inventive Example 1. Thus, the under cladding layer and the over cladding layer were formed by using the varnish A, and the core portions were formed by using the varnish B, whereby an optical waveguide was produced (see FIG. 1).

INVENTIVE EXAMPLE 3

The blending amount of the component B and the blending amount of the component C in the varnish A which was the material for the formation of the cladding layer were changed to 20 parts by weight and 50 parts by weight, respectively. Except for this, Inventive Example 3 was similar to Inventive Example 1. Thus, the under cladding layer and the over cladding layer were formed by using the varnish A, and the core portions were formed by using the varnish B, whereby an optical waveguide was produced (see FIG. 1).

INVENTIVE EXAMPLE 4

The component C in the varnish A which was the material for the formation of the cladding layer was replaced with 20 parts by weight of the polyfunctional oxetane compound (component C') having the dicyclopentadiene ring with the oxetanyl group introduced therein which was represented by the structural formula (B) and synthesized in [Second Synthesis of Polyfunctional Oxetane Compound] described above. Except for this, Inventive Example 4 was similar to Inventive Example 1. Thus, the under cladding layer and the over cladding layer were formed by using the varnish A, and the core portions were formed by using the varnish B, whereby an optical waveguide was produced (see FIG. 1).

INVENTIVE EXAMPLE 5

The blending amount of the component A, the blending amount of the component B, the blending amount of the component C and the blending amount of the component G in the varnish A which was the material for the formation of the cladding layer were changed to 35 parts by weight, 20 parts by weight, 10 parts by weight and 1 part by weight, respectively. Additionally, 35 parts by weight of [1-ethyl(3-oxetanyl)]methyl ether (Aron Oxetane OXT-221 manufactured by Toagosei Co., Ltd.) was used as a new component C". Except for this, Inventive Example 5 was similar to Inventive Example 1. Thus, the under cladding layer and the over cladding layer were formed by using the varnish A, and the core portions were formed by using the varnish B, whereby an optical waveguide was produced (see FIG. 1).

COMPARATIVE EXAMPLE

The component C (polyfunctional oxetane compound) in the varnish A which was the material for the formation of the cladding layer was replaced with 20 parts by weight of trimethylolpropane polyglycidyl ether (Denacol EX-321 manufactured by Nagase ChemteX Corporation) (component E). Except for this, Comparative Example was similar to Inventive Example 1. Thus, the under cladding layer and the over cladding layer were formed by using the varnish A, and the core portions were formed by using the varnish B, whereby an optical waveguide was produced (see FIG. 1).

[Evaluation]

The above-mentioned produced optical waveguide was cut to a length of 1 cm by the use of a dicing apparatus, and was allowed to stand for 100 hours in an atmosphere at 85° C. and 85% (in relative humidity). The coefficient of moisture absorption of the optical waveguide allowed to stand was evaluated by a Karl Fischer technique to be described below. The results of the evaluation were presented in Table 1 below together with the constituents of the varnishes A and B in Inventive and Comparative Examples.

[Measurement of Coefficient of Moisture Absorption]

Each of under cladding layers and over cladding layers obtained in Inventive Examples 1 to 5 and Comparative Example was allowed to stand for 100 hours at 85° C. and 85% (in relative humidity). Thereafter, the coefficient of moisture absorption of the film was measured with a trace moisture measuring device (Hiranuma moisture measuring device AQUACOUNTER AQ-2100 manufactured by Hiranuma Sangyo Co., Ltd.).

TABLE 1

| | Constituents of Varnish A | | | | | | (part by weight) Constituents of Varnish B (*) |
|---|---|---|---|---|---|---|---|
| | Inventive Examples | | | | | Comparative Example | |
| | 1 | 2 | 3 | 4 | 5 | | |
| Component A | 30 | 30 | 30 | 30 | 35 | 30 | 50 |
| Component B | 50 | 30 | 20 | 50 | 20 | 50 | — |
| Component C | 20 | 40 | 50 | — | 10 | — | — |
| Component C' | — | — | — | 20 | — | — | — |
| Component C" | — | — | — | — | 35 | — | — |
| Component D | — | — | — | — | — | — | 22 |
| Component E | — | — | — | — | — | 20 | — |
| Component F | — | — | — | — | — | — | 28 |
| Component G | 2 | 2 | 2 | 2 | 1 | 2 | 1.0 |
| Coefficient of Moisture Absorption (%) | 1.83 | 1.02 | 0.88 | 1.24 | 0.50 | 2.43 | |

(*) Common to Inventive and Comparative Examples

Component A: bisphenoxyethanolfluorene diglycidyl ether

Component B: alicyclic epoxy resin (CELLOXIDE 2021P manufactured by Daicel Chemical Industries, Ltd.)

Component C: polyfunctional oxetane compound represented by structural formula (A)

Component C': polyfunctional oxetane compound represented by structural formula (B)

Component C": [1-ethyl(3-oxetanyl)]methyl ether (Aron Oxetane OXT-221 manufactured by Toagosei Co., Ltd.)

Component D: 1,3,3-tris(4-(2-(3-oxetanyl)butoxyphenyl)butane)

Component E: trimethylolpropane polyglycidyl ether (Denacol EX-321 manufactured by Nagase ChemteX Corporation)

Component F: ethyl lactate

Component G: 50% propione carbide solution of 4,4-bis[di(β-hydroxyethoxy)phenylsulfinio]phenyl-sulfide-bis-hexafluoroantimonate The above-mentioned results show that the optical waveguide articles produced according to Inventive Examples are low in coefficient of moisture absorption to have excellent resistance to moisture as compared with an article produced according to Comparative Example.

Examples of the optical waveguide according to the present invention include a linear optical waveguide, a curved optical waveguide, a crossing optical waveguide, a Y-branch optical waveguide, a slab optical waveguide, a Mach-Zehnder optical waveguide, an AWG type optical waveguide, a grating, an optical waveguide lens, and the like. Examples of optical devices employing the above-mentioned optical waveguide include a wavelength filter, an optical switch, an optical divider, an optical multiplexer, an optical multiplexer/demultiplexer, an optical amplifier, a wavelength converter, a wavelength divider, an optical splitter, a directional coupler, an optical transmission module provided by hybrid integration of laser diodes and photodiodes, and the like.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. An optical waveguide comprising a substrate, a cladding layer formed on the substrate, and a core portion formed in a predetermined pattern in said cladding layer for propagating an optical signal, wherein at least one of said cladding layer and the core portion is formed of a resin composition containing a polyfunctional oxetane compound having a dicyclopentadiene ring which is represented by the following general formula (1):

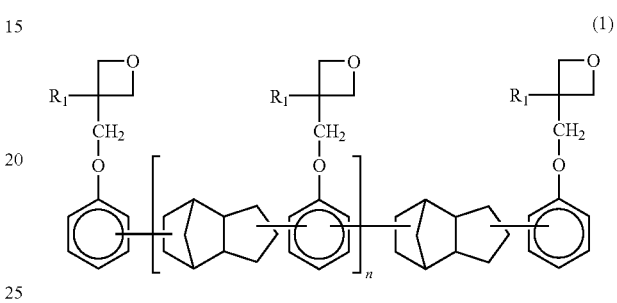

wherein the groups $R_1$ may be the same as or different from each other and each represent a hydrogen atom or an alkyl group having one to six carbon atoms, and n is a positive number ranging from 1 to 5.

2. The optical waveguide according to claim 1, wherein at least one of said cladding layer and said core portion is formed of a resin composition containing the polyfunctional oxetane compound of general formula (1) and a compound having an epoxy group or a vinyl ether group.

3. The optical waveguide according to claim 1, wherein said cladding layer is formed of a resin composition containing the polyfunctional oxetane compound of general formula (1) and a compound having an epoxy group or a vinyl ether group, and said core portion is formed of a resin composition containing a trifunctional oxetane compound, other than the polyfunctional oxetane compound of general formula (1), and a compound having an epoxy group or a vinyl ether group.

* * * * *